United States Patent [19]

Baker

[11] 4,125,814

[45] Nov. 14, 1978

[54] HIGH-POWER SWITCHING AMPLIFIER

[75] Inventor: Richard H. Baker, Bedford, Mass.

[73] Assignee: Exxon Research & Engineering Co., Linden, N.J.

[21] Appl. No.: 829,334

[22] Filed: Aug. 31, 1977

[51] Int. Cl.² ............................................ H03F 3/217
[52] U.S. Cl. .................................. 330/251; 307/254; 330/156
[58] Field of Search ................... 330/156, 207 A, 251; 307/214, 254; 328/176

[56] References Cited

U.S. PATENT DOCUMENTS

| 3,899,692 | 8/1975 | Caswell | 328/176 X |
| 3,975,647 | 8/1976 | Takei | 328/176 X |
| 4,002,931 | 1/1977 | Tsang et al. | 328/176 X |

*Primary Examiner*—James B. Mullins
*Attorney, Agent, or Firm*—Kenneth Watov

[57] ABSTRACT

A switching amplifier includes a grounded collector NPN Darlington amplifier having a main current path connected between a terminal for receiving an operating voltage and an output terminal, and an input base and output emitter electrodes across which a series circuit of the main conduction of an NPN transistor and a floating DC voltage supply are connected. In response to a switching signal applied to its base electrode, the NPN transistor turns on to connect in "bootstrap" the DC voltage supply directly across the base and emitter electrodes of the Darlington amplifier, for turning on and operating the Darlington amplifier at its maximum power and rated voltage or current capability.

14 Claims, 6 Drawing Figures

HIGH-POWER SWITCHING AMPLIFIER

The field of the invention relates generally to switching amplifiers, and more particularly to high-power switching amplifiers.

Many present high-power semiconductor switching amplifiers or circuits include in their output stages a combination of NPN and PNP transistors. PNP transistors cannot be produced with current, voltage, power and speed performance equivalent to NPN transistors. These differences in capabilities are primarily due to relative material properties, mainly the lower mobility of holes in the N-type base region of the PNP transistor relative to the mobility of the electrons in the P-type silicon in the base of the NPN transistors. With present technology, NPN transistors are now available to operate above 600 volts at current levels up to about 100 amperes, whereas PNP transistors are limited to about 20 amperes at 100 volts, and only 5 amperes at 250 volts. Accordingly, the current, voltage and power capability of switching amplifiers having both PNP and NPN transistors in their output stages is limited by the PNP transistors. The present inventor, in recognition of the limitations of present switching amplifiers, has invented an output stage for a high-power switching circuit or amplifier using only NPN transistors, thereby permitting the NPN transistors to be operated up to their maximum voltage, current and power capabilities.

The present invention includes an output stage of a high-power switching amplifier having a grounded collector NPN transistor switching means driven by turning on an NPN switching transistor for connecting a feedback circuit of a DC voltage source from the emitter electrode to the base electrode of the NPN switching means, via the main conduction path of the NPN switching transistor.

In the drawings, where like items are indicated by the same reference designations:

Figure 1:
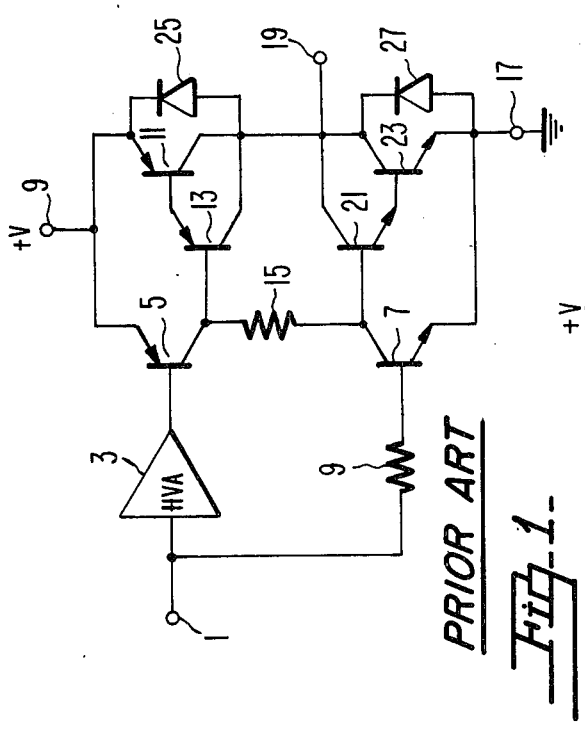
FIG. 1 is a circuit schematic diagram of a prior art PNP/NPN switching amplifier.

In FIG. 1, a prior art switching amplifier is shown in a PNP/NPN configuration for providing voltage and current gain. In operation, a positive level control signal applied to the control terminal 1 is connected via the high voltage amplifier 3 to the base of the PNP transistor 5, and to the base of the NPN transistor 7 via input resistor 9. Transistor 5 is held nonconductive or cut off, and transistor 7 is turned on in response to the positive level control signal. When transistor 7 so turns on, current flows from the operating voltage terminal 9 for receiving an operating voltage +V, through the base-emitter current paths of the PNP transistors 11 and 13 (these transistors being configured as a PNP Darlington Amplifier), load resistor 15, the main current path of transistor 7 to terminal 17 connected to a point of reference potential, ground in this example. In this manner, transistors 11 and 13 are turned on for substantially applying the positive voltage +V to the output terminal 19. When the level of the control signal applied to input or control terminal 1 is changed from a high to a low level, ground or some negative voltage, for example, transistor 7 is turned off and the PNP transistor 5 is turned on. In this circuit condition, current flows from terminal 9 through the main current path of transistor 5, resistor 15, the base-emitter junctions of NPN transistors 21 and 23, to terminal 17, causing the NPN Darlington circuit 21, 23 to turn on. Because transistor 5 is conductive, it holds the Darlington circuit 13,11 off. Turnon of the NPN Darlington circuit 21,23 causes output terminal 19 to be substantially connected to ground via the main conduction path of NPN transistor 23. In this manner, output terminal 19 is switched between some positive level of voltage +V and ground. The diodes 25 and 27 are included to permit bilateral operation of bidirectional current flow between output terminal 19 and terminals 19 and 17. Since transistors 5, 7, 11 plus, 13, 21 plus and 23 are connected as grounded-emitter switching amplifiers, both current and voltage gain are provided by this nonlinear switching circuit. The voltage +V is limited to a level 100 volts, and the current that can be delivered to output terminal 19 is limited to a magnitude of about 20 amperes, thereby limiting the power-handling capability of the circuit to about 2 kilowatts. These operating limitations are due to the voltage, current and power limitations of the PNP transistors 11 and 13. It should be noted that the high voltage amplifier 3 is required because the base electrode of transistor 5 is operated at a voltage level $1V_{BE}$ down from +V when transistor 5 is turned on ($1V_{BE}$ being the voltage drop across the base emitter junction of a conducting transistor, transistor 5 in this case). Transistor 5 is turned off by applying a voltage to its base electrode which is greater than or equal to +V.

Figure 2:
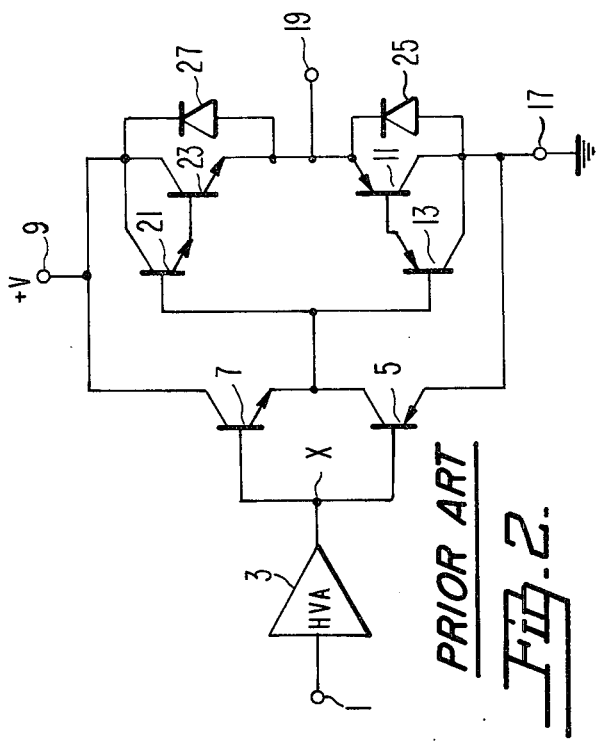
FIG. 2 is a circuit schematic diagram of a prior art NPN/PNP switching amplifier.

In FIG. 2, resistors 15 and 19 of FIG. 1 have been eliminated, and the current rearranged in another prior art configuration known as an NPN/PNP switching amplifier. In this configuration, when a control signal is applied to control terminal 1, amplifier 3 responds by applying at point X a voltage having a level of $+V+3V_{BE}$, NPN transistor 7 and the NPN Darlington circuit 21,23 are turned on for substantially connecting the positive voltage +V to the output terminal 19. The transistors 5, 11 and 13 are turned off at this time. When the control signal changes level to ground or some negative level, transistor 5 and the PNP Darlington 11,13 are turned on, for substantially connecting output terminal 19 to ground, transistors 7, 21 and 23 being turned off at this time. All of the transistors 5, 7, 11, 13, 21 and 23 are connected as a grounded collector switch or amplifier, thereby providing current gain only. Substantially no voltage gain is obtained from this configuration, because the voltages applied to the base electrodes of these transistors for turning them on is substantially the same level of voltage that appears at the emitter electrodes of the transistors when they are turned on. As before, the circuit of FIG. 2 is limited in current to about 20 amperes, and voltage to about 100 volts, and therefore the power to about 2 kilowatts because of the limited capability of the PNP transistors 11 and 13.

Figure 3:
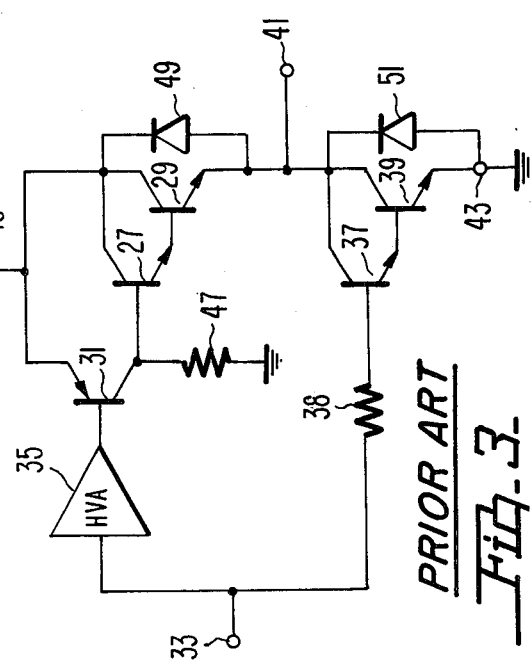
FIG. 3 is a circuit schematic diagram of a prior art NPN/NPN—PNP switching amplifier.

In FIG. 3 in another prior art switching amplifier circuit configuration known as an NPN/NPN-PNP configuration, an NPN Darlington amplifier 27,29 is driven by a grounded-emitter PNP switching transistor 31. In this circuit, the PNP transistor 31 can be a high-voltage, low-powered transistor, and therefore can be operated at a higher voltage level than the PNP transistors 5 in the circuits of FIGS. 1 and 2. PNP transistor 31 can be operated at voltages of about 250 volts with a collector-emitter current $I_{CE}$ of about 5 amperes. However, the PNP transistor 31 still limits the switching amplifier circuit to low-frequency operation (low switching speed), because for high-frequency operation (fast switchng application during circuit transition), the NPN Darlington amplifier 27,29 must be overdriven by a factor of about 5; that is, about 50 amperes must be driven into the base electrode of NPN transistor 27 for operating the NPN Darlington amplifier 27,29 during the fast transition at a current level of 250 amps (assuming that the transient current gain of the Darlington amplifier 27,29 is about 5). The control signal applied to control terminal 33 is applied via the high-voltage amplifier 35 to the base of transistor 31, and via input resistor 38 to the base electrode of NPN transistor 37. When the level of the control signal is sufficiently positive, the NPN Darlington amplifier 37,39 is turned on for connecting the output terminal 41 substantially to ground via the main current conduction path of NPN transistor 39 (connected between output terminal 41 and ground terminal 43). At this time, the high-voltage amplifier 35 responds to the positive level control signal by applying a voltage substantially equal to the voltage +V (applied to operating voltage terminal 45) to the base electrode of transistor 31, for keeping this transistor 31 turned off. When the control signal has a voltage level substantially at ground, or below ground, NPN Darlington amplifier 37,39 is turned off, and the high-voltage amplifier 35 responds by applying a voltage at least $1V_{BE}$ down from +V to the base electrode of transistor 31, turning on transistor 31. When transistor 31 so turns on, it substantially connects the operating voltage +V via its main current conduction path to resistor 47 and the base electrode of NPN transistor 27. Current flows from terminal 45, through the main current conduction path of transistor 31, into the base electrode of transistor 27, causing the NPN Darlington amplifier 27,29 to turn on, for connecting the operating voltage +V to the output terminal 41 substantially via the main current conduction path of transistor 29. The NPN Darlington amplifier 27,29 provides current gain (grounded collector connection), and the NPN Darlington amplifier 37,39 provides both current and voltage gain (grounded emitter circuit). The diodes 49 and 51 serve the same purpose as their counterparts in the circuits of FIGS. 1 and 2. An important item in the prior art circuits of FIGS. 1–3 is that the NPN transistors in the output stage cannot be operated at their maximum available current, voltage, and power levels, because of the limitations impose by the necessity of using PNP driver transistors.

In summation, the prior art switching circuits or amplifiers of FIGS. 1 and 2, showing PNP/NPN and NPN/PNP configurations, respectively, can best be used in low-voltage switching applications (less than 100 volts) and at power levels up to about 2 kilowatts. The NPN/NPN-PNP switching amplifier of FIG. 3 is useful up to 250 volts at power levels up to about 5 or 6 kilowatts. For higher voltage or power switching applications, suitable PNP switching transistors are not available, as previously explained, and consequently circuit design becomes progressively more complex as the power level is increased.

Figure 4:
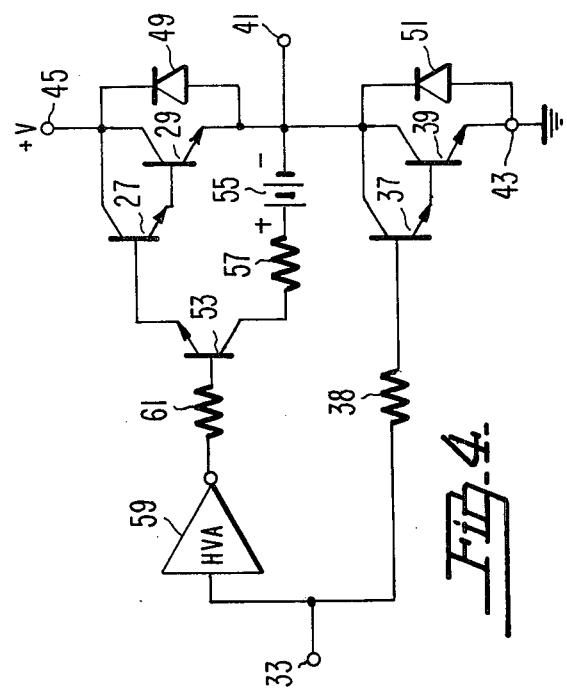
FIG. 4 is a circuit schematic diagram of a first embodiment of the invention.

In FIG. 4, a first embodiment of the invention is shown for obtaining an improved high-power switching amplifier using only NPN transistors. In comparison to the prior art circuit of FIG. 3, the improvement that allows to NPN Darlington amplifier 27,29 to be driven by an NPN transistor 53, instead of a PNP transistor 31, is the floating power supply incorporating the battery 55, arranged in a feedback mode to supply power through a resistor 57 and the main current path of NPN transistor 53 to drive the base of NPN transistor 27, as will be explained in more detail. Other changes made in the circuit of FIG. 4 in comparison to that of FIG. 3 include the replacement of the noninverting high-voltage amplifier 35 with an inverting high-voltage amplifier 59, and the addition of an isolation resistor 61 connected between the output terminal of the inverting high-voltage amplifier 59 and the base electrode of the NPN switching transistor 53. When a control signal having a voltage at ground or some negative level is applied to the control or input terminal 33, the second NPN Darlington amplifier 37,39 is turned off, and the inverting high-voltage amplifier 59 responds by applying a positive level signal via isolation resistor 61 to the base electrode of NPN switching transistor 53, turning on transistor 53. When transistor 53 so turns on, current flows from the floating voltage source 55 to the base terminal of transistor 27, which turns on the NPN Darlington 27,29, to apply a positive level output signal to output terminal 41. The level of this output signal will be substantially equal to the level of the operating voltage +V minus the voltage drop $V_{CE}$ across the collector-emitter electrodes of NPN transistor 29. Due to the connection of the negative terminal of the DC voltage supply 55 (a battery in this example) to output terminal 41, at substantially the instant in time that the voltage at the output terminal 41 is driven positive, the DC voltage supply 55 goes positive and supplies current to the base electrode of NPN transistor 27 via the conduction path including collector resistor 57 and the main current path of NPN transistor 53, for keeping the Darlington amplifier 27,29 turned on so long as transistor 53 is turned on. In other words, as soon as the level of the voltage at output terminal 41 goes positive, the DC voltage supply 55 applies a voltage at the base of NPN transistor 27 (this voltage has a level that is greater than a value equal to the level of the output voltage $+2V_{BE}$ for transistors 27,29, plus the $V_{CE}$ voltage drop across the collector-emitter electrodes of transistor 53, and the voltage drop across collector resistor 57), and for supplying current to the base electrode of NPN transistor 27 for maintaining the Darlington amplifier 27,29 turned on in saturation so long as transistor 53 is turned on. The Darlington amplifier 27,29 is connected in an emitter follower configuration or what is known as a grounded collector configuration, requiring that for a given level of output voltage to be obtained, a level of voltage greater than this desired level of output voltage by at least $2V_{BE}$ of transistors 27,29 must be applied to the base electrode of NPN transistor 27. The method shown in FIG. 4 of using a floating voltage supply 55 in a feedback connection provides the large voltage swing required at the base electrode of the grounded collector NPN Darlington amplifier 27,29 output stage for obtaining a relatively high level of output voltage, without using a PNP transistor as in the circuit of FIG. 3. As previously described, in FIG. 3 the PNP transistor 31 limits the level of the operation voltage +V to about 250 volts, in turn limiting the level of the output voltage that can be obtained at output terminal 41 to just below 250 volts. In this first embodiment of the invention in FIG. 4, much higher levels of output voltage and power can be obtained because of the use of the NPN transistor 53, which transistor can be an NPN having a voltage rating, say 600 volts. Also, if high-power operation is required along with the high-voltage operation, the NPN Darlington amplifier 27,29 can use 600-volt, 100-ampere NPN transistors 27,29. Accordingly, with the circuit of FIG. 4, a level of output voltage of about 600 volts, with an output current having a magnitude of up to about 100 amperes, can be provided. Similarly, the grounded emitter NPN Darlington amplifier 37,39 can incorporate high-power NPN transistors, for sinking up to about 100 amperes from output terminal 41 to ground if, for example, a load impedance is connected between output terminal 41 and some level of DC voltage at about 600 volts. In effect, the substitution for a PNP transistor of an NPN transistor 53 and floating DC voltage supply 55 provides an "inverted polarity power switch" for a new switching amplifier or circuit, in comparison to those circuits of the prior art using PNP driver transistors. It should also be noted that although the circuit of FIG. 4 is primarily for high-power switching applications, it can also be applied for use in low-power switching applications, such as high voltage but low current, high current but low voltage, or low voltage and low current, where the NPN transistors would accordingly be low-power transistors, as the requirements dictate.

Figure 5:
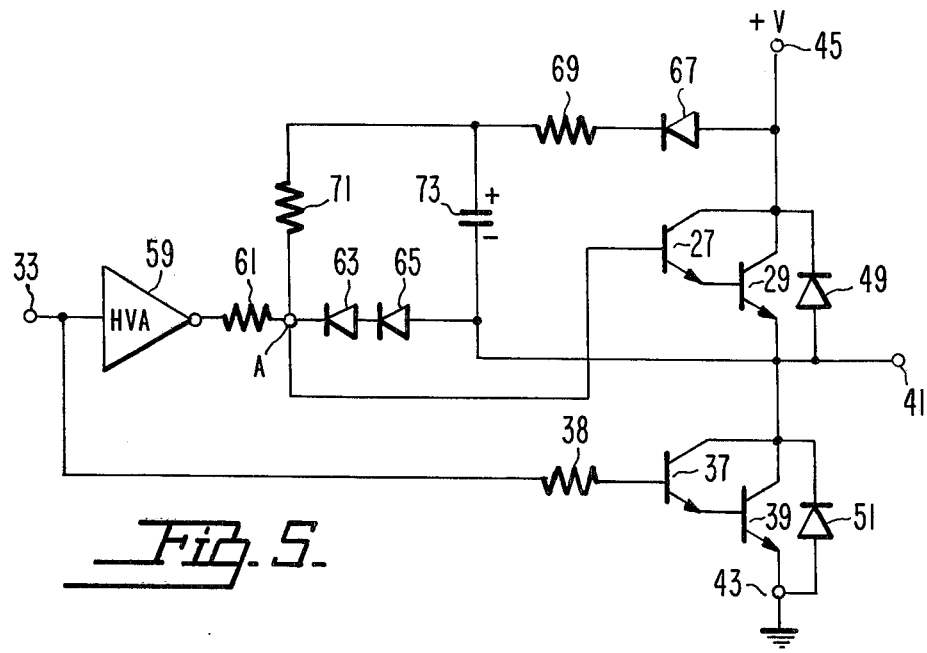
FIG. 5 is a circuit schematic diagram of a second embodiment of the invention.

In FIG. 5, a second embodiment of the invention is a modification of the circuit of FIG. 4, including three diodes 63,65,67, two resistors, 69,71, and a capacitor 73, connected as shown for providing a floating DC voltage supply in substitution for the DC voltage supply 55 and its feedback circuit components including resistor 57 and NPN transistor 53. In operation, when a control signal having a positive level of voltage is applied to control terminal 33, the NPN Darlington amplifier 37,39 responds by turning on, and the high-voltage inverting amplifier 59 responds by producing an output signal at ground or some negative voltage level, causing point A to be at ground or close to this negative voltage level. At this time, the Darlington amplifier 27,29 is turned off by the signal at point A, and blocking diodes 63,65 and 67 are forwardbiased. Current is allowed to flow from operating voltage terminal 45 through the series circuit including the diodes 63,65,67, resistors 61,69, capacitor 73 and Darlington 37,39 into terminal 43. This flow of current charges the capacitor 73 at a rate determined by the product of the total resistance in the previously-mentioned series circuit times the value of capacitance of the capacitor 73. At the same time current flows from terminal 41 through diodes 63 and 65, whereby the forward voltage drop across diodes 63 and 65 keeps the Darlington transistors 27,29 biased off. In the charging mode of operation, the capacitor 73 develops a voltage drop thereacross having the polarity indicated, and approaching the level of the operating voltage +V as the capacitor 73 takes on charge. When the level of the control signal is changed to ground or some negative level, Darlington amplifier 37,39 is turned off, and inverting amplifier 59 responds by raising the level of its output signal to some positive level of voltage, sufficient in magnitude to backbias the diodes 63 and 65. In response to the positive level of signal now at point A, the NPN Darlington amplifier 27,29 turns on, for driving the level of voltage at output terminal 41 positive. As soon as the level of voltage at output terminal 41 goes positive, diode 67 is backbiased and capacitor 73 begins to discharge in a feedback circuit including resistor 71, into the base electrode of NPN transistor 27, and also applies a sufficient amplitude of voltage via resistor 71 at this base electrode of NPN transistor 27 for maintaining the NPN Darlington amplifier 27,29 in saturation, for driving the output signal at output terminal 41 to a level approaching that of the operating voltage +V. Diode 67 also prevents capacitor 73 from discharging through the main current path of Darlington amplifier 27,29, when the latter is turned on. So long as point A is held at a positive level sufficient to backbias diodes 63 and 65, the capacitor 73 will continue to discharge through the feedback circuit as described, maintaining the Darlington amplifier 27,29 in a saturated mode of operation. In certain switching applications, it may not be necessary to have the Darlington amplifier 27,29 operate in a saturation mode. Such operation occurs when the combination of the voltage across capacitor 73 and the value of resistor 71 are such that the current flowing through 71 is insufficient to drive the Darlington circuit 27,29 into a conduction state for applying substantially +V to terminal 41. It is assumed that the time constants involved in the charging and discharging of the capacitor 73, the discharge time constant being determined by the product of the capacitance of capacitor 73 times the impedance represented by resistor 71. The frequency of switching (the frequency of the control signal applied to terminal 33), is such that the capacitor 73 always has sufficient time to recharge to a level sufficient for maintaining the Darlington amplifier 27,29 in saturation, during the periods of ground or negative level of the control signal at terminal 33. It should be noted that during the discharge time of capacitor 73, the diode 67 serves as a blocking diode, preventing the capacitor 73 from discharging into the collector electrodes of the NPN transistors 27,29 of the Darlington amplifier.

Figure 6:
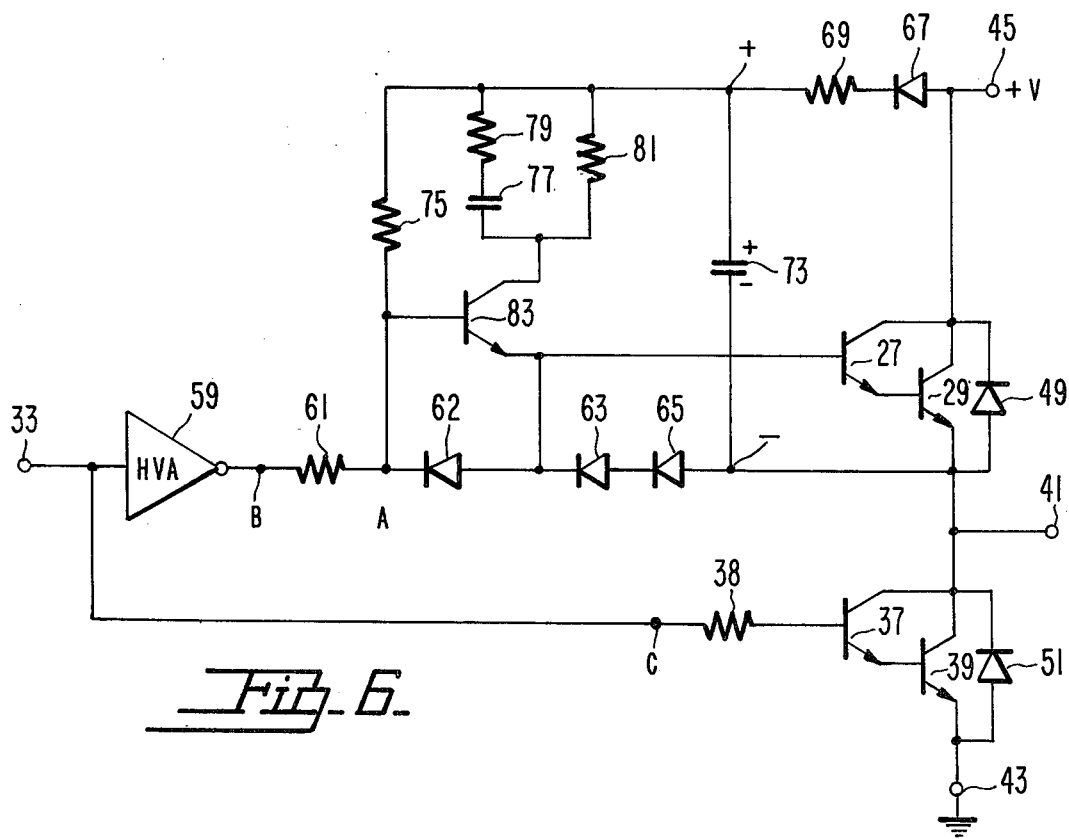
FIG. 6 is a circuit schematic diagram of a third embodiment of the invention.

In FIG. 6, a modification of the circuits of FIGS. 4 and 5 includes from amongst other elements an NPN switching transistor 83 for providing additional gain to improve the turnon time for the Darlington amplifier 27,29. In operation, when a control signal having a positive level of voltage is applied to the control terminal 33, the NPN Darlington amplifier 37,39 responds by turning on for substantially connecting output terminal 41 to ground via the main conduction path of the Darlington 37,39 and the high-voltage inverting amplifier 59 responds by producing a low-level or ground signal at point A, as previously described. At this time, NPN transistor 83 is turned off, and diodes 62,63,65, and 67 are forwardbiased, permitting capacitor 73 to take on charge from the voltage source supplying the voltage level +V to operating voltage terminal 45. The charging path for capacitor 73 is identical to that of the circuit in FIG. 5. When the control signal goes low, the Darlington amplifier 37,39 turns off, and the inverting amplifier 59 responds by changing the level of its output signal to a positive voltage. When point B is allowed to go positive (no longer held at a negative potential), diode 62 becomes backbiased, and the current flowing through resistor 75 flows into the base electrode of and causes NPN transistor 83 to turn on. At the time of turnon of transistor 83, the speedup capacitor 77 appears as a short-circuit or closed conduction path, causing resistors 79 and 81 to be placed in parallel at the instant of turnon, and current flows from operating voltage terminal 45 through the conduction paths including resistors 81, and resistor 79, in series with capacitor 77, the main current path of NPN transistor 83

(collector-emitter current path), into the base electrode of NPN transistor 27, thereby turning on the Darlington amplifier 27,29. When the Darlington amplifier 27,29 so turns on, current flows from the operating terminal 45 through the main current path of the Darlington amplifier 27,29 to the output terminal 41, raising the level of voltage at the output terminal to a positive level, permitting capacitor 73 to begin discharging initially through the circuit of resistor 81 in parallel with the series circuit of resistor 79 and capacitor 77, the main current path of transistor 83, into the base electrode of NPN transistor 27. Once the speedup capacitor 77 becomes appreciably charged, it appears as an open circuit, effectively removing resistor 79 and itself from the parallel connection with resistor 81. Therefore, when this occurs, the effective resistance of the parallel circuit will now increase to the value of resistance of resistor 81 through which all of the current is now passing. The speedup circuit of resistor 79 and capacitor 77 is known in the art, and enhances the turnon time for transistor 83, and accordingly also the turnon time of the Darlington amplifier 27,29. As in the circuit of FIG. 5, the capacitor 73 while discharging into the Darlington amplifier 27,29 acts to increase the level of voltage applied to the base electrode (voltage at terminal 41 plus voltage across capacitor 73) of NPN transistor 27 to ensure that the Darlington amplifier 27,29 goes into saturation for substantially applying the operating voltage $+V$ to output terminal 41, as previously described for the circuit of FIG. 5. In the circuits of FIGS. 5 and 6, current flowing in the forward direction through diodes 63 and 65 maintain the NPN Darlington amplifier 27,29 turned off whenever the level of voltage at point A is low, preventing the voltage across the base-emitter electrodes of the Darlington amplifier 27,29 from becoming forwardbiased. In other words, during the charging time of capacitor 73, current flowing through diodes 65 and 63 causes a backbias of $2V_{BE}$ to be applied across the base-emitter electrodes of the Darlington amplifier 27,29 for maintaining the Darlington amplifier in a cutoff condition. Similarly, the diode 62 backbiases and base-emitter junction of transistor 83 by $IV_{BE}$ during the charging time of capacitor 73.

Although in the above description of the three embodiments of the invention, the circuits of the invention are described for including NPN conductivity transistors, opposite conductivity transistors (PNP substituted for NPN) can be employed by reversing the poling or polarity of the diodes, and changing the polarity of the operating voltage, as would be clear to one skilled in the art. The PNP equivalent circuit may be useful in relatively low-power applications, whereas as pointed out above, the NPN conductivity circuits are required for high-power switching applications. Also, in FIGS. 4, 5 and 6 the isolation resistors 38 and 61 permit one to connect a plurality of switching amplifiers as shown in parallel, for increasing the power capability of the switching system by a multiple equivalent to the number of stages connected in parallel. For example, in FIG. 6 a number of output stages having circuits identical to the circuitry between point B and output terminal 41, and point C and output terminal 41, can be connected in parallel between these points for increasing the power capability as previously described.

What is claimed is:

1. A switching circuit comprising:
   an input terminal for receiving a control signal;
   an output terminal where an output signal is provided;
   a first terminal for receiving an operating voltage;
   a second terminal for receiving a source of reference potential;
   first transistorized amplifier means having a collector, an emitter and a base electrodes, said collector electrode being connected to said first terminal, said emitter electrode being connected to said output terminal;
   second transistorized amplifier means having a collector electrode connected to said output terminal, an emitter electrode connected to said second terminal, and a base electrode connected to said input terminal, responsive to said control signal for substantially connecting said reference potential to said output terminal;
   inverting amplifier means having an input terminal connected to said input terminal of the switching circuit, and an output terminal, for producing an output signal at its output terminal having a first level of voltage in response to said control signal, and a second level of voltage in the absence of said control signal;
   DC voltage supply means having a first polarity voltage terminal connected to said output terminal of said switching circuit, and an opposite polarity terminal; and
   transistorized switching means having the same conductivity as said first amplifier means, having a collector electrode connected to said opposite polarity terminal of said DC voltage supply means, an emitter electrode connected to the base electrode of said first amplifier means, and a base electrode connected to the output terminal of said inverting amplifier means, said DC voltage supply means being polarized for feeding back current from said emitter electrode to said base electrode each of said first amplifier means, via the collector-emitter current path of said transistorized switching means whenever turned on in response to said output signal of said inverting amplifier means being at said second level of voltage, for turning on said first transistorized amplifier means, thereby substantially applying said operating voltage to said output terminal of said switching circuit.

2. The switching circuit of claim 1, wherein said transistorized switching means further includes:
   a first resistor connected between said collector electrode of said transistorized switching means and said opposite polarity terminal;
   a capacitor;
   a second resistor connected in a series circuit with said capacitor in parallel with said first resistor, said series circuit providing a "speedup" circuit for providing a source of transient current for decreasing the turnon time of said transistorized switching means.

3. The switching circuit of claim 1, wherein said DC voltage supply means includes:
   diode means having an anode electrode connected to said first terminal, and a cathode electrode;
   charge storage means connected between said cathode electrode and said output terminal; and
   resistive means connected between the base electrode of said transistorized switching means and the common connection of said charge storage means and said cathode electrode.

4. The switching circuit of claim 3, wherein said charge storage means includes a capacitor.

5. The switching circuit of claim 1, wherein said DC voltage supply means includes a battery.

6. The switching circuit of claim 1 wherein said first and second transistorized current amplifier means each consist of an NPN Darlington amplifier, and said transistorized switching means consists of an NPN switching transistor.

7. The switching circuit of claim 1, wherein said inverting amplifier means consists of a relatively high-voltage inverting amplifier, said transistorized switching means consists of a high-voltage NPN switching transistor, and said first and second amplifier means each consist of relatively high-power NPN Darlington amplifier circuits.

8. A high-current, high-voltage switching amplifier configuration using only NPN switching transistors, comprising
   a first terminal for receiving a reference voltage;
   a second terminal for receiving an operating voltage;
   a third terminal for receiving a switching signal;
   a fourth terminal where an output signal is provided;
   first NPN transistor amplifier means having a base electrode, a collector electrode connected to said second terminal, and an emitter electrode connected to said fourth terminal;
   second NPN transistor amplifier means having a base electrode connected to said third terminal, a collector electrode connected to said fourth terminal, and an emitter electrode connected to said first terminal, responsive to a high-level switching signal for providing an output signal at said fourth terminal having a value substantially equal to said reference voltage;
   inverting amplifier means having an input terminal connected to said third terminal, and an output terminal responsive to a high-level switching signal for providing a low-level signal at said output terminal, and to a low-level switching signal for providing a high-level signal at said output terminal;
   NPN transistor switching means having a base electrode connected to the output terminal of said inverting amplifier means, an emitter electrode connected to the base electrode of said first NPN transistor amplifier means, a collector electrode, and a main current path between said emitter and collector electrodes; and
   DC voltage supply means having a positive terminal resistively connected to the collector electrode of said NPN switching transistor means, and a negative terminal to said fourth terminal;
   said NPN transistor switching means being turned on by said high-level signal from said inverting amplifier means, for providing a current conduction path between said DC voltage supply and the base of said first NPN transistor amplifier means, the latter responding by turning on, whereby said DC voltage supply feeds back current from said fourth terminal via the collector-emitter current conduction path of said NPN transistor switching means to the base of said first amplifier means, the level of voltage applied to this base at this time being the sum of the output voltage at said fourth terminal and the voltage of said DC voltage supply means.

9. The switching amplifier of claim 8, further including means for decreasing the turnon time of said NPN switching transistor means, said turnon time decreasing means including:
   a first resistor connected between the collector electrode of said NPN switching transistor means and the positive terminal of said DC voltage supply means;
   a capacitor, and
   a second resistor connected in a series circuit with said capacitor, said series circuit being connected in parallel with said first resistor.

10. The switching amplifier of claim 8, wherein said DC voltage supply means consists of a battery.

11. The switching amplifier of claim 8, further including a first resistor connected between the base electrode of said NPN switching transistor means and the positive terminal of said DC voltage supply means, the latter including:
   charge storage means connected between said positive and negative terminals of said DC voltage supply means;
   a second resistor;
   first diode means connected in series with said second resistor between said second and positive terminals;
   second diode means connected between said negative terminal and the emitter electrode of said NPN switching transistor; and
   third diode means connected between the emitter electrode of said NPN transistor switching means and the output terminal of said inverting amplifier means;
   said first, second, and third diode means being poled for conducting current from said second terminal through the series circuit of said second resistor, charge storage means, and first through third diode means, into the output terminal of said inverting amplifier means, whenever the output signal at said output terminal of said inverting amplifier is low, said second and third diode means when so conducting current are forwardbiased and act to produce a backbias voltage across the base and emitter electrodes of said first transistor amplifier and said NPN switching transistor means, respectively, also at this time a substantial portion of current for charging said charge storage means is conducted from said second terminal to said first terminal via the current conduction path therebetween consisting of said first diode means, second resistor, capacitor, and a main current path between the collector and emitter electrodes of said first NPN transistor amplifier means, and when the output signal from said inverting amplifier is high, said first, second and third diode means are backbiased, said NPN switching transistor means turns on for discharging said charge storage means through its main current path into the base electrode of said first amplifier means, said first diode means acting at this time to block the flow of discharge current from said charge storage means into the collector electrode of said first NPN transistor amplifier means.

12. The switching amplifier of claim 11, wherein said charge storage means includes a capacitor.

13. The switching amplifier of claim 11, further including:
   a third resistor connected between the collector electrode of said NPN switching transistor means and said positive terminal;
   a capacitor;
   a fourth resistor connected in a series circuit with said capacitor, this series circuit being connected in parallel with said third resistor, for decreasing the turnon time of said NPN switching transistor.

14. The switching amplifier of claim 8, wherein said first and second NPN transistor amplifiers each consist of NPN Darlington amplifiers.

* * * * *